(12) United States Patent
Park (10) Patent No.: US 11,183,672 B2
(45) Date of Patent: Nov. 23, 2021

(54) DISPLAY DEVICE HAVING FIRST AND SECOND ADHESIVE PORTIONS

(71) Applicant: Samsung Display Co., Ltd., Yongin-si (KR)

(72) Inventor: Seyoon Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 16/745,152

(22) Filed: Jan. 16, 2020

(65) Prior Publication Data

US 2020/0274104 A1    Aug. 27, 2020

(30) Foreign Application Priority Data

Feb. 27, 2019  (KR) .................. 10-2019-0023266

(51) Int. Cl.
| | |
|---|---|
| *H01L 51/00* | (2006.01) |
| *H01L 51/52* | (2006.01) |
| *G02F 1/13* | (2006.01) |
| *G09F 9/30* | (2006.01) |
| *H01L 27/32* | (2006.01) |
| *G02F 1/1335* | (2006.01) |

(52) U.S. Cl.
CPC ...... *H01L 51/5281* (2013.01); *H01L 51/0097* (2013.01); *H01L 51/5246* (2013.01); *H01L 51/5253* (2013.01); *G02F 1/133528* (2013.01); *G09F 9/301* (2013.01); *H01L 27/3244* (2013.01); *H01L 51/5293* (2013.01); *H01L 2251/5338* (2013.01)

(58) Field of Classification Search
CPC ............. H01L 51/5281; H01L 51/0097; H01L 51/5246; H01L 51/5253; H01L 51/5293; H01L 2251/5337; G02F 1/133528; G09F 9/301

See application file for complete search history.

(56) References Cited

U.S. PATENT DOCUMENTS

| | | | |
|---|---|---|---|
| 9,718,263 B2 * | 8/2017 | Namkung | ............... B32B 37/12 |
| 9,753,317 B2 | 9/2017 | Gupta et al. | |
| 10,212,811 B1 * | 2/2019 | Zhang | ................. H01L 27/3244 |
| 10,222,834 B2 * | 3/2019 | Choi | ..................... G06F 1/1652 |
| 10,374,194 B2 * | 8/2019 | Son | ..................... H01L 51/5246 |
| 10,388,713 B2 * | 8/2019 | Son | ....................... H01L 27/323 |
| 10,429,986 B2 * | 10/2019 | Kim | ..................... G06F 3/04164 |

(Continued)

FOREIGN PATENT DOCUMENTS

| | | |
|---|---|---|
| JP | 2017-187705 A | 10/2017 |
| KR | 10-2014-0081672 A | 7/2014 |

(Continued)

*Primary Examiner* — Ida M Soward
(74) *Attorney, Agent, or Firm* — Lewis Roca Rothgerber Christie LLP (57) ABSTRACT

A display device includes a display panel including a bending area and a non-bending area adjacent to the bending area, a polarizing layer on the display panel and overlapping with the non-bending area, a support layer on the display panel and overlapping with the bending area, and an adhesive layer including a first adhesive portion between the non-bending area of the display panel and the polarizing layer and a second adhesive portion between the bending area of the display panel and the support layer.

20 Claims, 8 Drawing Sheets

(56) References Cited

U.S. PATENT DOCUMENTS

| | | | |
|---|---|---|---|
| 10,481,728 B2* | 11/2019 | Kim | H01L 51/5281 |
| 10,658,436 B2* | 5/2020 | Shin | H01L 51/56 |
| 10,707,429 B2* | 7/2020 | Jin | H01L 27/3276 |
| 10,714,562 B2* | 7/2020 | Yang | H01L 27/3258 |
| 10,734,612 B2* | 8/2020 | Wu | G06F 1/1652 |
| 10,897,018 B2* | 1/2021 | Jeon | H01L 51/5281 |
| 10,897,021 B2* | 1/2021 | Jung | H01L 27/3246 |
| 10,916,735 B2* | 2/2021 | Kwon | H01L 51/5056 |
| 2017/0294621 A1 | 10/2017 | Higano et al. | |
| 2018/0217308 A1 | 8/2018 | Nam et al. | |
| 2018/0315951 A1 | 11/2018 | Seong et al. | |
| 2019/0094610 A1* | 3/2019 | Yukawa | G02F 1/133308 |
| 2020/0286961 A1* | 9/2020 | Jeong | H01L 27/3223 |

FOREIGN PATENT DOCUMENTS

| | | |
|---|---|---|
| KR | 10-2018-0058283 A | 6/2018 |
| KR | 10-2018-0120311 A | 11/2018 |

* cited by examiner

DISPLAY DEVICE HAVING FIRST AND SECOND ADHESIVE PORTIONS

CROSS-REFERENCE TO RELATED APPLICATIONS

This application claims priority to and the benefit of Korean Patent Application No. 10-2019-0023266, filed on Feb. 27, 2019 in the Korean Intellectual Property Office, the entire content of which is hereby incorporated by reference.

BACKGROUND

1. Field

Aspects of embodiments of the present disclosure herein relate to a display device.

2. Description of the Related Art

Various display devices used in multimedia apparatuses, such as televisions, mobile phones, tablet computers, navigation units, and game consoles, have been developed. The display device may include a display module for displaying an image, a polarizing layer disposed on a display panel, and a window. The display module may include a display panel for displaying an image and an input sensing layer for detecting an external input.

The image outputted through the display panel may be seen through the window. The external input detected by the input sensing layer may be substantially an external input applied to the window. The polarizing layer may be disposed on an adhesive layer disposed on the display module to reduce external reflection.

SUMMARY

According to an aspect of embodiments of the present disclosure, a display device including a polarizing layer is provided. According to another aspect of embodiments of the present disclosure, a display device of which a manufacturing process may be simplified is provided.

According to one or more embodiments of the inventive concept, a display device includes: a display panel including a bending area and a non-bending area adjacent to the bending area; a polarizing layer on the display panel and overlapping with the non-bending area; a support layer on the display panel and overlapping with the bending area; and an adhesive layer including a first adhesive portion between the non-bending area of the display panel and the polarizing layer and a second adhesive portion between the bending area of the display panel and the support layer.

In an embodiment, the support layer and the polarizing layer may be provided as an integrated shape and contacting each other.

In an embodiment, the second adhesive portion may have a curved shape and be arranged over the entire bending area of the display panel, and the support layer may have a curved shape and be arranged over the entire second adhesive portion.

In an embodiment, each of the support layer and the second adhesive portion may not overlap with the non-bending area.

In an embodiment, the support layer may have a same thickness as the polarizing layer.

In an embodiment, the display panel may include: a base substrate including a flat portion corresponding to the non-bending area and a bending portion bent from the flat portion and corresponding to the bending area; a display element layer on the flat portion; and an encapsulation layer on the display element layer. The first adhesive portion may be between the encapsulation layer and the polarizing layer.

In an embodiment, the flat portion may include a first flat portion and a second flat portion, which are spaced apart from each other in a thickness direction of the base substrate.

In an embodiment, the display device may further include a protection layer between the first flat portion and the second flat portion to support the first flat portion.

In an embodiment, the first adhesive portion and the second adhesive portion may be provided as an integrated shape, and the first adhesive portion and the second adhesive portion may have a same thickness as each other.

In an embodiment, the display device may further include: a window including a display area and a non-display area adjacent to the display area, and arranged on the polarizing layer; and a window adhesive layer between the window and the polarizing layer. The bending area of the display panel may entirely overlap with the non-display area.

According to one or more embodiments of the inventive concept, a display device includes: a display panel including a bending area and a non-bending area adjacent to the bending area; a polarizing layer on the display panel and overlapping with the non-bending area; a support layer including a first support portion on the display panel and overlapping with the non-bending area and a second support portion on the display panel and overlapping with the bending area; and an adhesive layer including a first portion between the display panel and the polarizing layer and overlapping with the non-bending area and a remaining portion between the display panel and the first support layer.

In an embodiment, the first portion of the adhesive layer may have a planar area greater than that of the remaining portion of the adhesive layer.

In an embodiment, the second support portion may have a curved shape and be arranged over the entire bending area of the display panel.

In an embodiment, the adhesive layer may not overlap with the bending area.

In an embodiment, the display panel may include: a base substrate including a flat portion corresponding to the non-bending area and a bending portion bent from the flat portion and corresponding to the bending area; a display element layer on the flat portion; and an encapsulation layer on the display element layer and overlapping with the flat portion. The first support portion may be on the adhesive layer overlapping with the flat portion, and the second support portion may be on the bending portion.

In an embodiment, at least a portion of the second support portion may be spaced apart from the display panel.

In an embodiment, the polarizing layer and the support layer may be provided as an integrated shape.

In an embodiment, the adhesive layer may have a uniform thickness.

In an embodiment, the support layer may have a same thickness as the polarizing layer.

In an embodiment, the first support portion may contact the polarizing layer.

BRIEF DESCRIPTION OF THE FIGURES

The accompanying drawings are included to provide a further understanding of the inventive concept, and are incorporated in and constitute a part of this specification.

The drawings illustrate some example embodiments of the inventive concept and, together with the description, serve to explain principles of the inventive concept. In the drawings.

DETAILED DESCRIPTION

Some example embodiments of the inventive concepts will now be described more fully with reference to the accompanying drawings, in which some example embodiments are shown. Example embodiments of the inventive concepts may, however, be embodied in many different forms and should not be construed as being limited to the embodiments set forth herein.

In this specification, it is to be understood that when one component (or region, layer, portion) is referred to as being "on," "connected to," or "coupled to" another component, it may be directly disposed/connected/coupled on/to the one component, or one or more intervening third components may also be present.

Like reference numerals refer to like elements throughout. Also, in the figures, the thickness, ratio, and dimensions of components may be exaggerated for clarity of illustration.

The term "and/or" includes any and all combinations of one or more of the associated listed items.

It is to be understood that although terms such as "first" and "second" are used herein to describe various elements, these elements should not be limited by these terms. The terms are used to distinguish one component from other components. For example, a first element referred to as a "first" element in one embodiment may be referred to as a "second" element in another embodiment without departing from the scope of the appended claims. The terms of a singular form may include plural forms unless referred to the contrary.

Also, "under," "below," "above," "upper," and the like may be used for explaining relation association of components illustrated in the drawings. However, the terms may be a relative concept and described based on directions expressed in the drawings and are not intended as limiting.

Unless otherwise defined, all terms (including technical and scientific terms) used herein have the same meaning as commonly understood by one of ordinary skill in the art to which example embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

The meaning of "include" or "comprise" may specify a property, a fixed number, a step, an operation, an element, a component, or a combination thereof, but does not exclude other properties, fixed numbers, steps, operations, elements, components, or combinations thereof.

Herein, some example embodiments of the inventive concept will be described with reference to the accompanying drawings.

Figure 1A:
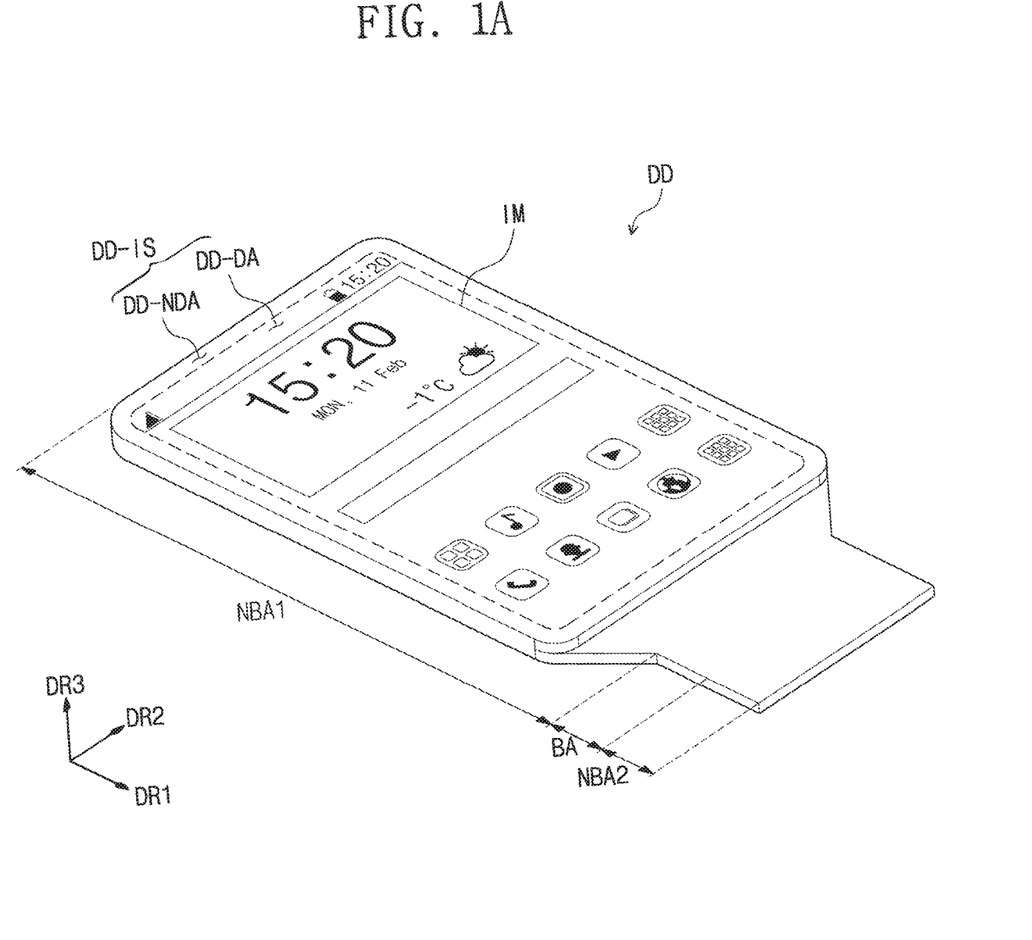
FIGS. 1A and 1B are perspective views illustrating a display device according to an embodiment of the inventive concept.
Figure 1B:
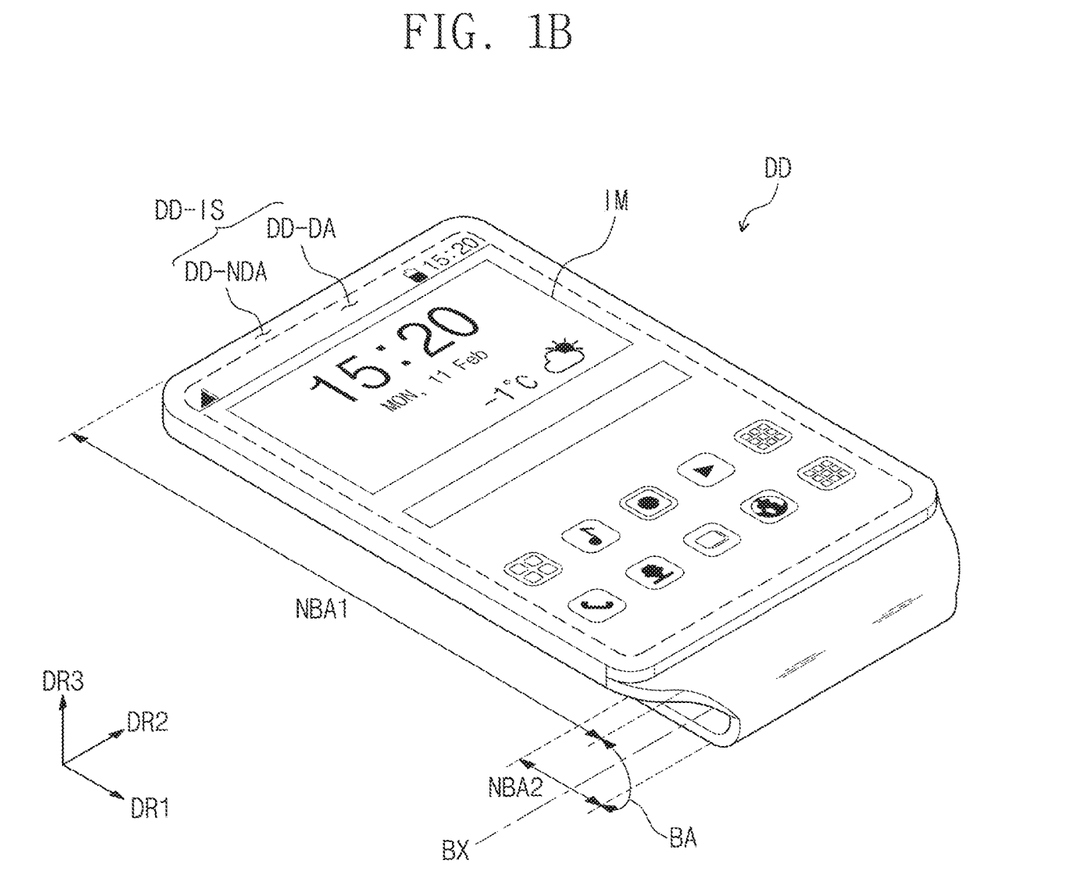

FIGS. 1A and 1B are perspective views illustrating a display device according to an embodiment of the inventive concept. Referring to FIGS. 1A and 1B, a display surface DD-IS may have a shape extending in each of a first direction DR1 and a second direction DR2 crossing the first direction DR1. A normal direction of the display surface DD-IS, i.e., a thickness direction of the display device DD, indicates a third direction DR3. In this specification, an expression of "when viewed from a plane or on a plane or planar area" may represent a case when viewed in the third direction DR3. Herein, a front surface (or top surface) and a rear surface (or bottom surface) of each of layers or units are distinguished by the third direction DR3. However, directions indicated by the first to third directions DR1, DR2, and DR3 may be a relative concept and converted with respect to each other.

Although it is described that the display device partially has the display surface DD-IS having a curved shape on a plane, the display device may include a three-dimensional display surface or a rectangular display surface. The three-dimensional display surface may include a plurality of display areas indicating directions different from each other, e.g., a polygonal cylinder shaped display surface.

Although not shown, as electronic modules, a camera module and a power module, which are mounted on a main board, may be disposed on a bracket/case together with the display device DD, and a mobile phone terminal may be constituted. The display device DD according to an embodiment of the inventive concept may be used for large-sized electronic devices, such as televisions and monitors, and small and medium-sized electronic devices, such as tablet computers, navigation units for vehicles, game consoles, and smart watches.

As illustrated in FIG. 1A, the display surface DD-IS includes a display area DD-DA on which an image IM is displayed and a non-display area DD-NDA disposed adjacent to the display area DD-DA. The non-display area DD-NDA is an area on which an image is not displayed. In FIG. 1A, images such as a clock window and icons are illustrated as an example of the image IM. In another embodiment, the non-display area DD-NDA may be disposed adjacent to only one side of the display area DD-DA, or omitted.

The display device DD according to an embodiment of the inventive concept may include a first non-bending area NBA1, a second non-bending area NBA2, and a bending area BA. The first non-bending area NBA1, the second non-bending area NBA2, and the bending area BA may be set with reference to the display panel DP that will be described later with respect to FIG. 4A.

On a plane, the display device DD may have widths that are different for each area in the second direction DR2. In an embodiment, each of the bending area BA and the second non-bending area NBA2 may have a width in the second direction DR2 which is less than a maximum width of the first non-bending area NBA1 in the second direction DR2. In an embodiment, since the bending area BA has a width that is relatively smaller than that of the first non-bending area NBA1, the bending area BA may be easily bent. In FIG. 1A, a boundary area of which a width gradually decreases in the second direction DR2 may be contained in the first non-bending area NBA1. However, embodiments of the inventive concept are not limited thereto. For example, in another embodiment, the boundary area of which a width gradually decreases in the second direction DR2 may be omitted.

FIG. 1B illustrates a bent state of the display device DD. The bending area BA is bent along a bending axis BX extending in the second direction DR2. In the bent state of the display device DD, the second non-bending area NBA2 faces the first non-bending area NBA1 while being spaced apart from the first non-bending area NBA1 in the third direction DR3.

Figure 2:
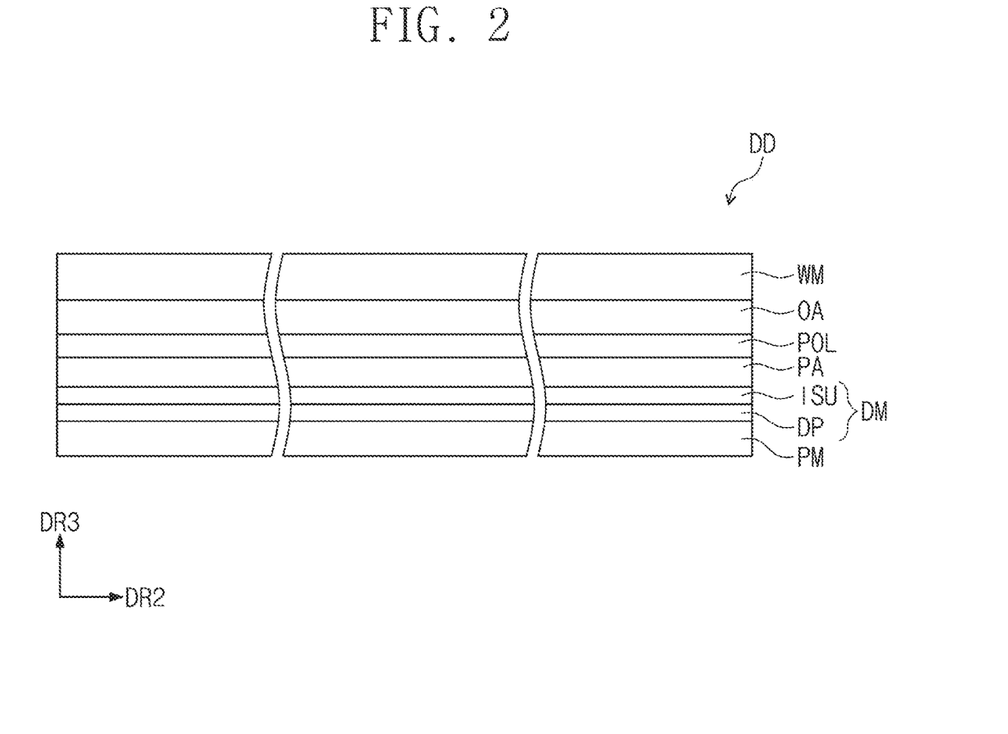
FIG. 2 is a cross-sectional view illustrating the display device according to an embodiment of the inventive concept.
Figure 3:
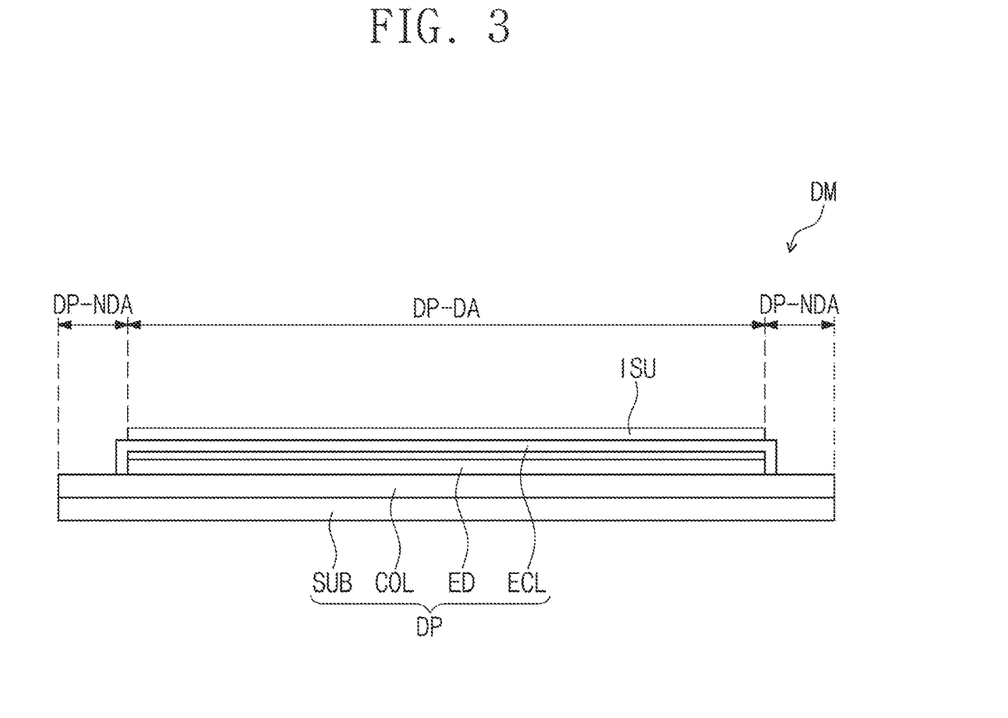
FIG. 3 is a cross-sectional view illustrating a display module according to an embodiment of the inventive concept.

FIG. 2 is a cross-sectional view illustrating the display device according to an embodiment of the inventive concept; and FIG. 3 is a cross-sectional view illustrating a display module according to an embodiment of the inventive concept.

Referring to FIG. 2, in an embodiment, the display device DD includes a protection layer PM, a display module DM, a polarizing layer POL, a window WM, a first adhesive layer PA, and a second adhesive layer OA.

The window WM may define the display surface DD-IS of the display device DD in FIG. 1A. That is, a top surface of the window WM may correspond to the display surface DD-IS, and, on the top surface of the window WM, the display area DD-DA from which an image is directly seen from the outside and the non-display area DD-NDA disposed adjacent to the display area DD-DA may be defined. The window WM may be made of any of various materials, such as a plastic substrate, a glass substrate, or an organic/inorganic composite substrate.

The display area DD-DA defined in the window WM may correspond to a transmission area through which an image provided from the display panel DP is substantially transmitted, and the non-display area DD-NDA may correspond to a non-transmission area through which the image provided from the display panel DP is not transmitted. Also, as described above, the non-transmission area of the window WM may be omitted.

In an embodiment, the display module DM includes a display panel DP for displaying an image and an input sensing layer ISU for detecting an external input.

The display panel DP is disposed between the protection layer PM and the input sensing layer ISU. The display panel DP may generate an image, and the generated image may be visible to an external user through the window WM.

According to an embodiment of the inventive concept, the display panel DP may include an organic light emitting display panel, a liquid crystal display panel, or a quantum dot light emitting display panel. However, embodiments of the inventive concept are not particularly limited thereto. The organic light emitting display panel includes organic light emitting elements. The liquid crystal display panel includes liquid crystal molecules. The quantum dot light emitting display panel includes a quantum dot or a quantum rod. Herein, the display panel DP according to an embodiment of the inventive concept will be described as the organic light emitting display panel.

In an embodiment, as illustrated in FIG. 3, the display panel DP includes a base substrate SUB, a circuit element layer COL, a display element layer ED, and an encapsulation layer ECL. The display panel DP includes a display area DP-DA and a non-display area DP-NDA. The display area DP-DA and the non-display area DP-NDA of the display panel DP may overlap the display area DD-DA and the non-display area DD-NDA of the display device DD in FIG. 1A, respectively.

The base substrate SUB may support all of components of the display panel DP and the input sensing layer ISU, and include a flexible material. For example, the base substrate SUB may include a plastic substrate, a glass substrate, or an organic/inorganic composite substrate. In an embodiment, the base substrate SUB may be a laminated structure including a plurality of insulation layers. In an embodiment, the plastic substrate may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

According to an embodiment of the inventive concept, the bending area BA, the first non-bending area NBA1, and the second non-bending area NBA2 of the display device DD described in FIGS. 1A and 1B may be defined by the base substrate SUB of the display panel DP. Herein, in this specification, the bending area BA, the first non-bending area NBA1, and the second non-bending area NBA2 of the display panel DP are described as the bending area BA, the first non-bending area NBA1, and the second non-bending area NBA2 of the base substrate SUB.

The circuit element layer COL may include a plurality of insulation layers, a plurality of conductive layers, and a semiconductor layer. The plurality of conductive layers of the circuit element layer COL may constitute signal lines and a control circuit of a pixel.

The display element layer ED overlaps the display area DP-DA and is disposed on the base substrate SUB. The display element layer ED includes a display element, e.g., organic light emitting diodes. However, embodiments of the inventive concept are not limited thereto. For example, the display element layer ED may include inorganic light emitting diodes or organic-inorganic hybrid light emitting diodes.

The encapsulation layer ECL seals the display element layer ED. For example, the encapsulation layer ECL may overlap each of the display area DP-DA and the non-display area DP-NDA or may not overlap the non-display area DP-NDA.

According to an embodiment of the inventive concept, the encapsulation layer ECL may be provided as a thin-film encapsulation layer. The thin-film encapsulation layer protects the display element layer ED from moisture, oxygen, and foreign substances, such as dust particles. In an embodiment, the encapsulation layer ECL may include at least one organic encapsulation layer and at least one inorganic encapsulation layer. The inorganic encapsulation layer protects the display element layer ED from moisture/oxygen, and the organic encapsulation layer protects the display element layer ED from foreign substances, such as dust particles. Although the inorganic encapsulation layer may include a silicon nitride layer, a silicon oxynitride layer, a silicon oxide layer, a titanium oxide layer, or an aluminum oxide layer, embodiments of the inventive concept are not particularly limited thereto. Although the organic encapsulation layer may include an acrylic-based organic layer, embodiments of the inventive concept are not particularly limited thereto.

As another example, the encapsulation layer ECL may be provided as an encapsulation substrate, and, in this case, the encapsulation layer ECL may be coupled with the base substrate SUB. For example, a sealant may include a frit.

In an embodiment, the input sensing layer ISU may be directly disposed on the display panel DP. In this specification, an expression of "component A is directly disposed on component B" represents a state in which an adhesive layer is not disposed between component A and component B. In an embodiment, the input sensing layer ISU may be manufactured with the display panel DP through a continuous process.

The input sensing layer ISU is disposed between the polarizing layer POL and the display panel DP. The input sensing layer ISU may detect an input applied from the outside. The input applied from the outside may be provided in any of various types. For example, the external input may include any of various types of external inputs, such as a portion of a user's body, a stylus pen, light, heat, or pressure. Also, the input generated by contact of a portion of a user's body, such as a finger, as well as a space touch generated by being adjacent or approached (e.g., hovering) may be one type of the input.

In another embodiment, the input sensing layer ISU may not be directly disposed on the display panel DP, and an adhesive layer may be disposed between the display panel DP and the input sensing layer ISU. Also, in another embodiment, the input sensing layer ISU may be omitted. In this case, the display module DM may include only the display panel DP.

Referring to FIG. 2 again, the protection layer PM may support the display panel DP. The protection layer PM prevents or substantially prevents external moisture from being permeated into the display panel DP and absorbs an external impact. In an embodiment, the protection layer PM may be made of a plastic resin. However, embodiments of the inventive concept are not limited to a plastic resin as the material of the protection layer PM. For example, the protection lay PM may include an organic/inorganic composite material. In an embodiment, the protection layer PM may include a porous organic layer and an inorganic material that is filled into pores of the organic layer. The protection layer PM may further include a functional layer provided on a plastic film. The functional layer may include a resin layer and be provided by a coating method.

A first adhesive layer PA is disposed between the display module DM and the polarizing layer POL. In an embodiment, the first adhesive layer PA may include an optically clear adhesive film (OCA), an optically clear resin (OCR), or a pressure sensitive adhesive film (PSA). Herein, the first adhesive layer PA will be exemplarily described as the pressure sensitive adhesive film (PSA).

The polarizing layer POL may be disposed between the window WM and the display module DM to control polarization of external light incident through the window WM. The polarizing layer POL may be connected to the display module DM through the first adhesive layer PA and connected to the window WM through the second adhesive layer OA. The second adhesive layer OA may be described as a window adhesive layer.

The second adhesive layer OA may be disposed between the window WM and the polarizing layer POL. In an embodiment, the second adhesive layer OA may include an optically clear adhesive film (OCA), an optically clear resin (OCR), or a pressure sensitive adhesive film (PSA). Herein, the second adhesive layer OA will be exemplarily described as the optically clear adhesive film (OCA).

According to an embodiment of the inventive concept, each of the first adhesive layer PA and the second adhesive layer OA may be made of a transparent material.

Figure 4A:
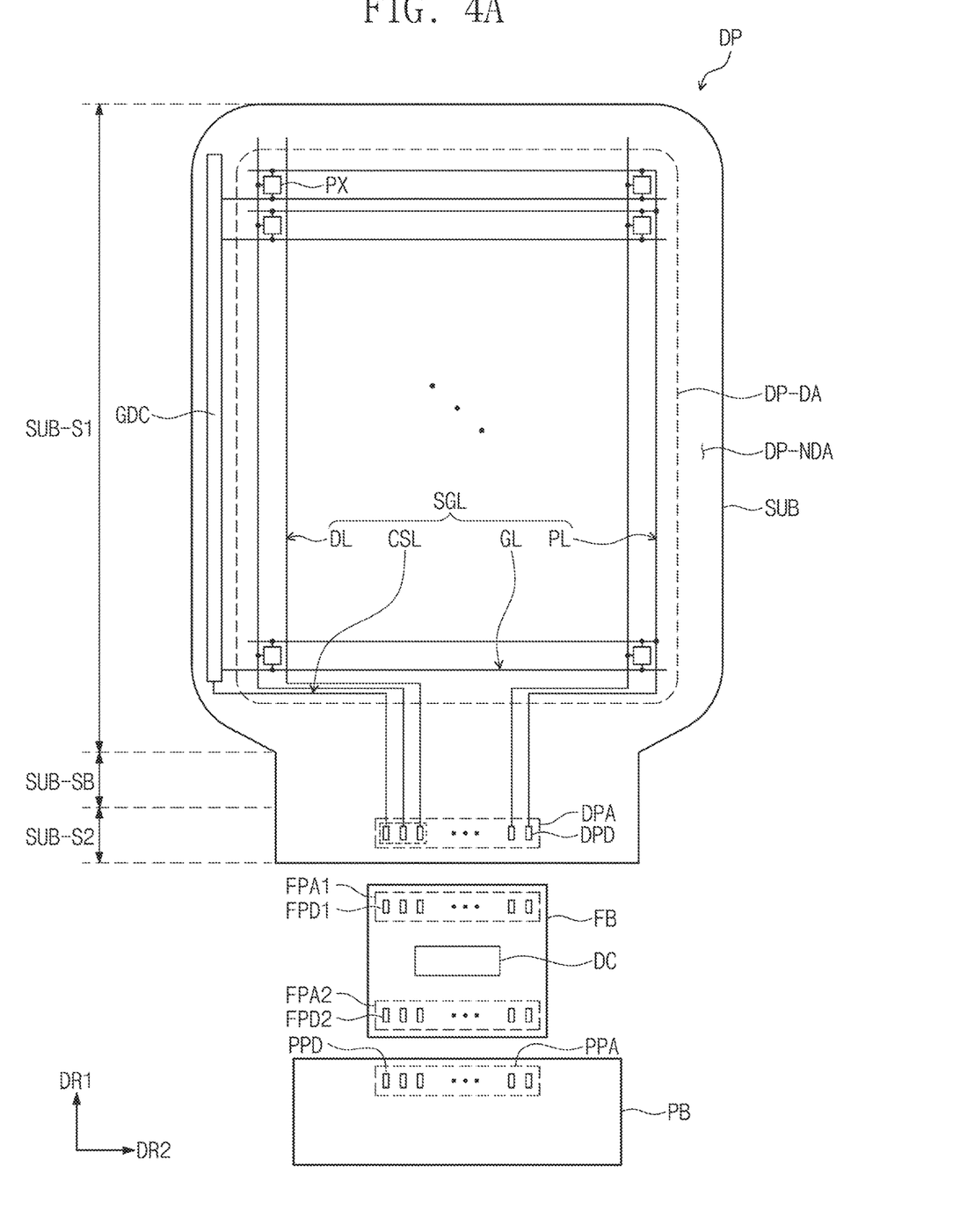
FIG. 4A is a plan view illustrating a display panel according to an embodiment of the inventive concept.
Figure 4B:
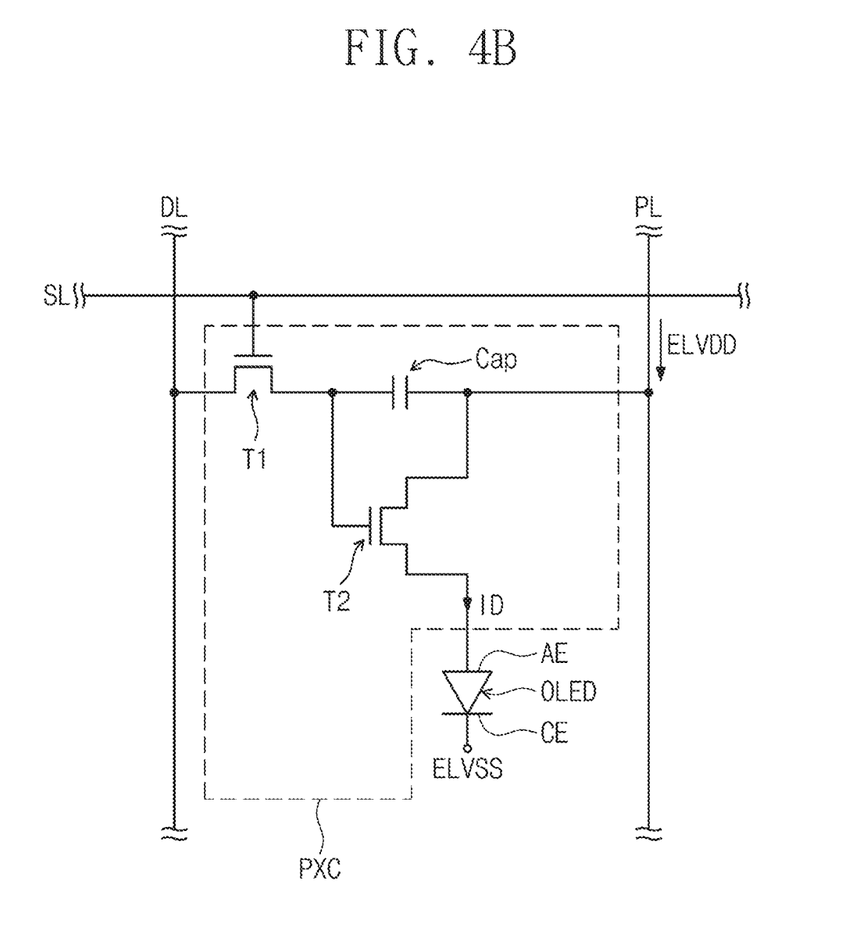
FIG. 4B is an equivalent circuit diagram of a pixel of the display panel according to an embodiment of the inventive concept.

FIG. 4A is a plan view illustrating the display panel according to an embodiment of the inventive concept; and FIG. 4B is an equivalent circuit diagram of a pixel of the display panel according to an embodiment of the inventive concept.

Referring to FIG. 4A, the display panel DP may include a driving circuit GDC, a plurality of signal lines SGL, a plurality of pads (herein, referred to as pads DPD) disposed on a pad area DPA, and a plurality of pixels PX (herein, referred to as pixels). The pixels PX are disposed on the display area DP-DA. Each of the pixels PX includes an organic light emitting diode and a pixel driving circuit connected thereto. The driving circuit GDC, the signal lines SGL, the pads DPD disposed on the pad area DPA, and the pixel driving circuit may be contained in the circuit element layer COL in FIG. 3.

The base substrate SUB includes a first flat portion SUB-S1 corresponding to the first non-bending area NBA1, a second flat portion SUB-S2 corresponding to the second non-bending area NBA2, and a bending portion SUB-SB corresponding to the bending area BA. On a plane, the first flat portion SUB-S1 may have an area greater than that of the second flat portion SUB-S2.

According to an embodiment of the inventive concept, the pixels PX of the display panel DP and the driving circuit GDC of the circuit element layer COL may be disposed on the first flat portion SUB-S1 of the base substrate SUB. Also, the display element layer ED in FIG. 3 is disposed on the first flat portion SUB-S1 of the base substrate SUB, and the encapsulation layer ECL is disposed on the display element layer ED. The signal lines SGL may be disposed on each of the first flat portion SUB-S1, the second flat portion SUB-S2, and the bending portion SUB-SB.

The driving circuit GDC generates a plurality of scan signals (herein, referred to as scan signals) and sequentially outputs the scan signals to a plurality of scan lines GL (herein, referred to as scan lines). The driving circuit GDC may further output another control signal to the driving circuit of the pixels PX.

The driving circuit GDC may include a plurality of thin-film transistors that, in an embodiment, are manufactured through a same process as the driving circuit of the pixels PX, e.g., a low temperature polycrystalline silicon (LTPS) process or a low temperature polycrystalline oxide (LTPO) process.

The signal lines SGL overlap the display area DP-DA and the non-display area DP-NDA, and are connected to the pads DPD. The signal lines SGL includes scan lines GL, data lines DL, a power line PL, and a control signal line CSL. The scan lines GL are connected to corresponding pixels of the pixels PX, respectively, and the data lines DL are connected to corresponding pixels of the pixels PX, respectively. The power line PL is also connected to the pixels PX. The control signal line CSL may provide control signals to the scan driving circuit.

In an embodiment, the display device DD includes a connection circuit board FB connected to an end of the display panel DP, and a driving circuit board PB connected to an end of the connection circuit board FB.

The connection circuit board FB may be provided as a flexible printed circuit board, and may include a first pad area FPA1 on which a plurality of first connection pads FPD1 are disposed and a second pad area FPA2 on which a plurality of second connection pads FPD2 are disposed. The driving circuit board PB may include a driving pad area PPA on which a plurality of driving pads PPD are disposed.

The first connection pads FPD1 are electrically bonded to the pads DPD of the display panel DP. The second connection pads FPD2 are electrically bonded to the driving pads PPD of the driving circuit board PB.

Also, a driving element DC may be disposed on the connection circuit board FB. The driving element DC may be electrically connected to the first connection pads FPD1 and the second connection pads FPD2. The driving circuit board PB may transmit driving signals, which are necessary for driving the display device DD, to the driving element DC. The driving element DC may receive the driving signals through the second connection pads FPD2 connected to the driving pads PPD. The driving element DC may generate signals, which are provided to the display panel DP, on the basis of the received driving signals, and provide the generate signals to the display panel DP through the first connection pads FPD1. For example, the driving element DC may be a data driver for generating image signals and control signals, which are provided to the data lines DL.

Referring to FIG. 4B, the pixel PX connected to one scan line GL, one data line DL, and the power line PL among the pixels in FIG. 4A is exemplarily illustrated. However, embodiments of the inventive concept are not limited to the configuration of the pixel PX shown in FIG. 4B. For example, the pixel PX may be varied in configuration.

According to an embodiment of the inventive concept, the pixel PX includes an organic light emitting element OLED, a first electrode AE, a second electrode CE, and a pixel circuit PXC. The pixel PX includes the organic light emitting element OLED as the display element. The organic light emitting element OLED, the first electrode AE, and the second electrode CE may be included in the display element layer ED in FIG. 3.

The pixel circuit PXC, which is a circuit for driving the organic light emitting element OLED, includes a first transistor T1 (or a switching transistor), a second transistor T2 (or a driving transistor), and a capacitor Cap. The pixel circuit PXC may be included in the circuit element layer COL in FIG. 3.

The organic light emitting element OLED generates light by an electrical signal provided from the first and second transistors T1 and T2.

The first transistor T1 outputs a data signal applied to the data line DL in response to a gate signal applied to the scan line GL. The capacitor Cap charges a voltage corresponding to the data signal received from the first transistor T1. A first power voltage ELVDD is provided to the first electrode AE through the second transistor T2, and a second power voltage ELVSS is provided to the second electrode CE. The second power voltage ELVSS may be less than the first power voltage ELVDD.

The second transistor T2 is electrically connected to the organic light emitting element OLED through the first electrode AE. The second transistor T2 controls a driving current ID flowing through the organic light emitting element OLED in correspondence to an electric charge quantity stored in the capacitor Cap. The organic light emitting element OLED emits light during a turn-on period of the second transistor T2.

Figure 5:
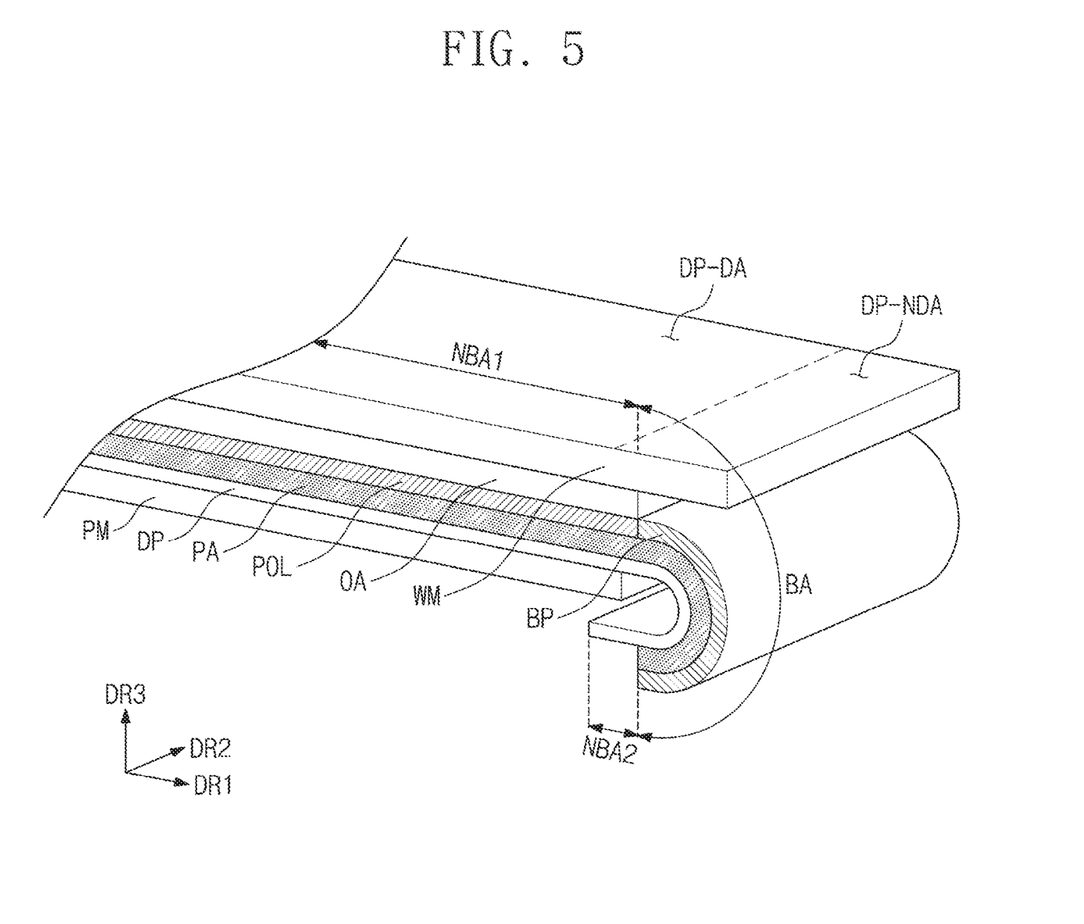
FIG. 5 is a perspective view illustrating a portion of a display device according to an embodiment of the inventive concept.
Figure 6:
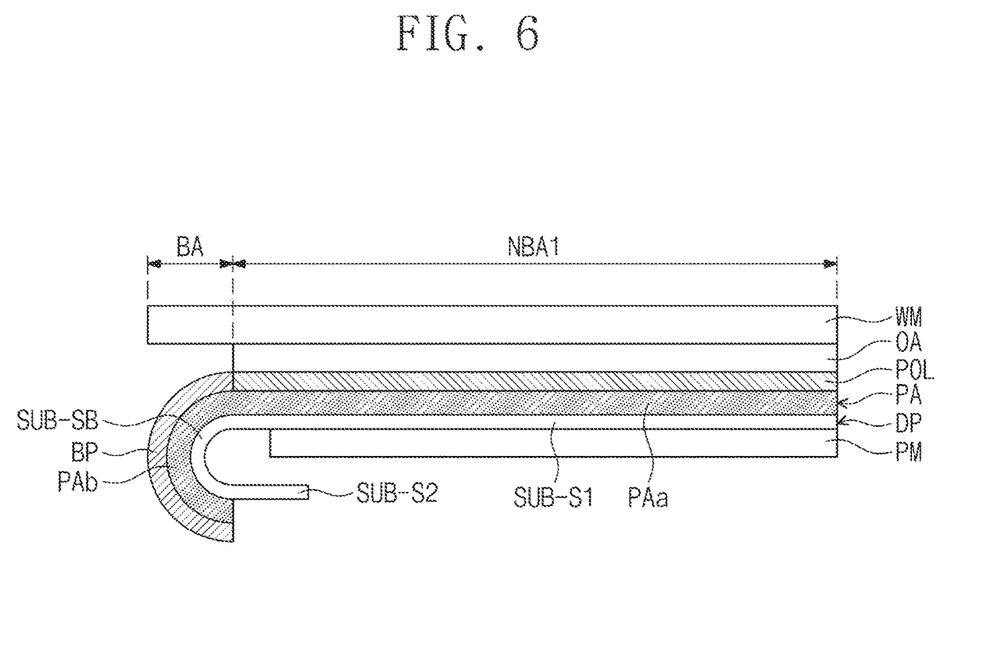
FIG. 6 is a cross-sectional view illustrating the display device in FIG. 5.
Figure 7:
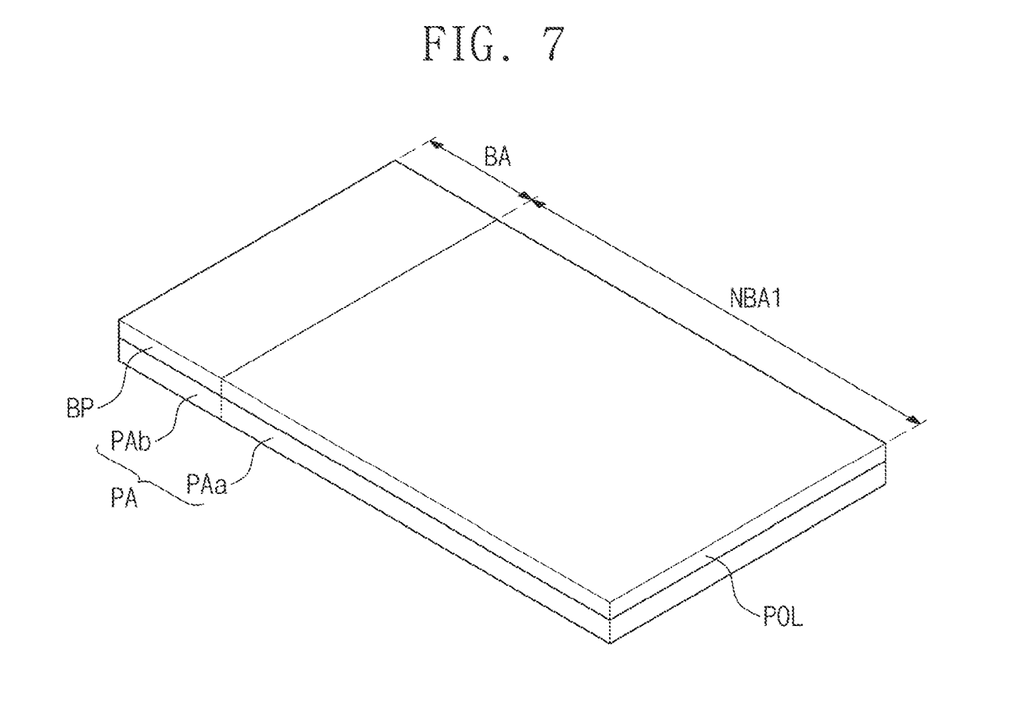
FIG. 7 is a perspective view illustrating a polarizing layer and a support layer according to an embodiment of the inventive concept.

FIG. 5 is a perspective view illustrating a portion of a display device according to an embodiment of the inventive concept; FIG. 6 is a cross-sectional view illustrating the display device in FIG. 5; and FIG. 7 is a perspective view illustrating a polarizing layer and a support layer according to an embodiment of the inventive concept.

FIG. 5 illustrates a display device according to an embodiment in which the input sensing layer ISU among components of the display device DD in FIG. 3 is omitted. Herein, in this specification, although the display device in which the input sensing layer ISU may be omitted is described, the input sensing layer ISU may be disposed on the display panel DP as another embodiment.

Referring to FIGS. 4A and 5, in an embodiment, the display area DP-DA of the display panel DP may entirely overlap with the first non-bending area NBA1 and partially overlap the second non-bending area NBA2. In an embodiment, the bending area BA may entirely overlap with the non-display area DP-NDA.

According to an embodiment of the inventive concept, the first adhesive layer PA may overlap each of the first non-bending area NBA1 and the bending area BA. The first adhesive layer PA is disposed between the polarizing layer POL and the display panel DP. Also, the first adhesive layer PA is disposed between a support layer BP and the display panel DP.

As illustrated in FIGS. 6 and 7, the first adhesive layer PA includes a first adhesive portion PAa and a second adhesive portion PAb. For convenience of description, the first adhesive layer PA before being bent is illustrated in FIG. 7.

The first adhesive portion PAa overlaps with the first non-bending area NBA1 of the display panel DP and is disposed between the display panel DP and the polarizing layer POL. The first adhesive portion PAa may have a shape corresponding to the first flat portion SUB-S1 of the base substrate SUB and may be directly disposed on the encapsulation layer ECL of the display panel DP in FIG. 2.

The second adhesive portion PAb overlaps with the bending area BA of the display panel DP and is disposed between the display panel DP and the support layer BP. The second adhesive portion PAb may have a curved shape corresponding to the bending portion SUB-SB of the base substrate SUB, and may be disposed over the entire bending portion SUB-SB of the base substrate SUB. In an embodiment, the second adhesive portion PAb may be directly disposed on the bending portion SUB-SB of the base substrate SUB.

The first adhesive layer PA according to an embodiment of the inventive concept may have an integrated shape of the first adhesive portion PAa and the second adhesive portion PAb. In an embodiment, the first adhesive portion PAa and the second adhesive portion PAb may have a same thickness as each other.

The polarizing layer POL may overlap with the first non-bending area NBA1 and may be disposed on the first adhesive portion PAa. The polarizing layer POL may have a shape corresponding to the first flat portion SUB-S1 of the base substrate SUB.

The support layer BP may be disposed on the second adhesive portion PAb while overlapping with the bending area BA of the display panel DP. According to an embodiment, each of the support layer BP and the second adhesive portion PAb may not overlap the first non-bending area NBA1 and the second non-bending area NBA2. Also, each of the support layer BP and the second adhesive portion PAb may have a curved shape corresponding to the bending portion SUB-SB of the base substrate SUB.

The support layer BP may cover the bending portion SUB-SB of the base substrate SUB to reduce a tensile stress of the display panel DP corresponding to the bending area BA. For example, the support layer BP may be made of polyimide, polyethylene naphthalate, polyethylene terephthalate, polyarylate, polycarbonate, polyetherimide, or polyethersulfone. However, embodiments of the inventive concept are not limited to the material of the support layer BP. For example, the support layer BP may be made of any of various materials.

According to an embodiment of the inventive concept, the support layer BP and the polarizing layer POL may be provided as one integrated shape. In an embodiment, the support layer BP and the polarizing layer POL may be provided on the display panel DP through one process.

For example, as illustrated in FIG. 7, the first adhesive portion PAa of the first adhesive layer PA is adhered to the polarizing layer POL, and the second adhesive portion PAb of the first adhesive layer PA is adhered to the support layer BP. As the first adhesive portion PAa and the second adhesive portion PAb are provided as an integrated shape while being adhered to each other, the support layer BP and the polarizing layer POL, which are adhered to the first adhesive portion PAa and the second adhesive portion PAb, respectively, may not be separated from each other. Although not shown, before the first adhesive layer PA is adhered onto the display panel DP, a release film sheet may be adhered onto the first adhesive layer PA to prevent or substantially prevent an adhesion force of the first adhesive layer PA from being degraded.

Here, when the support layer BP is bent along the bending portion SUB-SB of the base substrate SUB, the support layer BP and the polarizing layer POL, which contact each other, may be spaced by a distance (e.g., a predetermined distance) from each other.

According to an embodiment of the inventive concept, a method for arranging the integrated shaped support layer BP and polarizing layer POL on the display panel DP may be performed such that the release film sheet adhered to the first adhesive layer PA is delaminated, and then the first adhesive layer PA is adhered onto the display panel DP. In this case, the first adhesive layer PA may be disposed on the display panel DP, and then the bending portion SUB-SB of the base substrate SUB may be bent.

As the first adhesive portion PAa of the first adhesive layer PA is adhered onto the display panel DP overlapping the first non-bending area NBA1, the polarizing layer POL may be disposed on the display panel DP through the first adhesive portion PAa. As the second adhesive portion PAb of the first adhesive layer PA is adhered onto the display panel DP overlapping the bending area BA, the support layer BP may be disposed on the display panel DP through the second adhesive portion PAb.

According to an embodiment of the inventive concept, as illustrated in FIG. 7, the support layer BP and the polarizing layer POL may have a same thickness as each other. In an embodiment, the support layer BP may have a planar area less than that of the polarizing layer POL.

On the other hand, typically, unlike in the embodiment of the inventive concept, each of the support layer and the polarizing layer are provided as an individual component. For example, a process of forming the polarizing layer on the display panel and a process of forming the support layer on the display panel are individually performed.

However, in an embodiment of the inventive concept, as the support layer BP and the polarizing layer POL are formed on the display panel DP through one process, a process time may be reduced. That is, an overall manufacturing process of the display device may be further easily performed.

Figure 8:
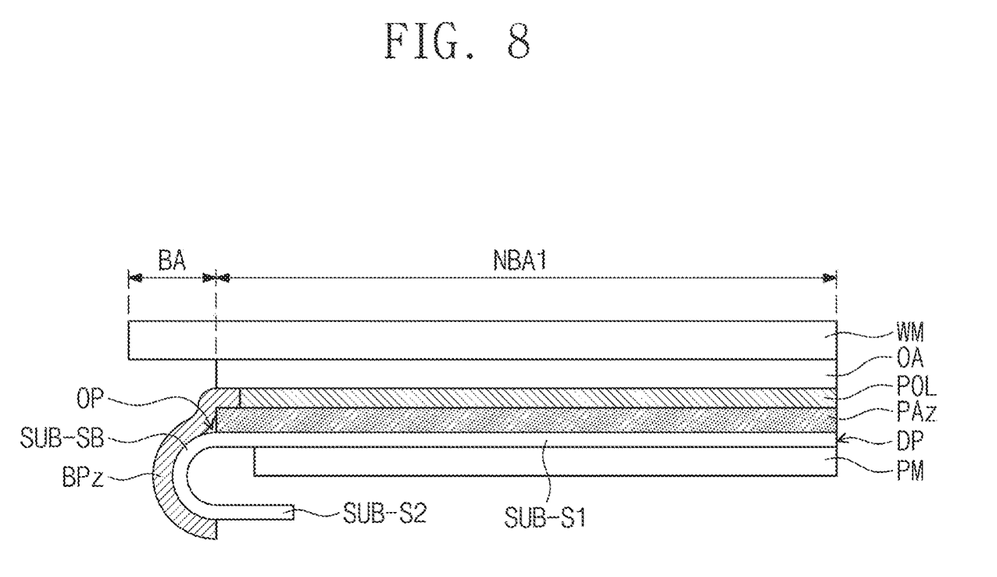
FIG. 8 is a cross-sectional view illustrating a portion of a display device according to another embodiment of the inventive concept.
Figure 9:
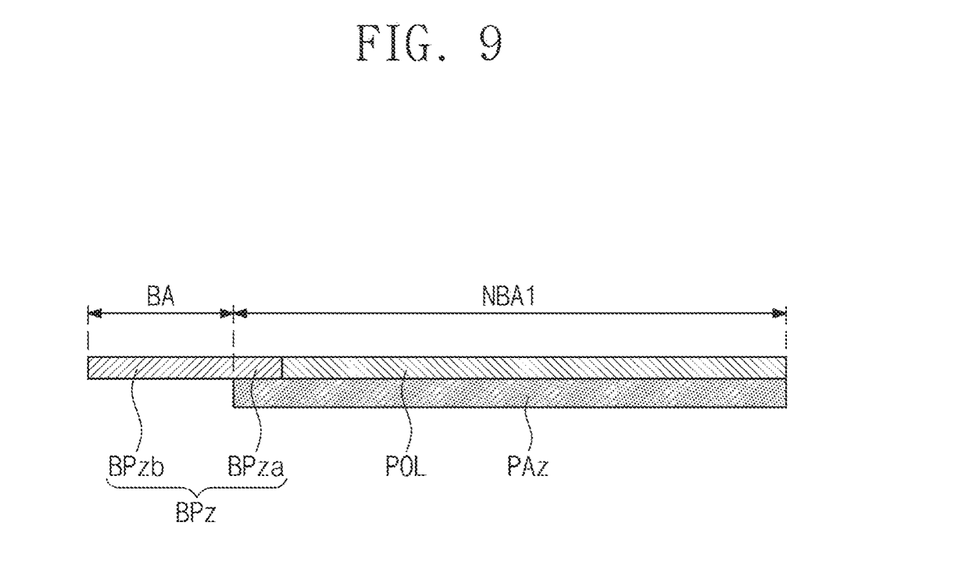
FIG. 9 is a cross-sectional view illustrating a polarizing layer and a support layer according to another embodiment of the inventive concept.

FIG. 8 is a cross-sectional view illustrating a portion of a display device according to another embodiment of the inventive concept; and FIG. 9 is a cross-sectional view illustrating a polarizing layer and a support layer according to another embodiment of the inventive concept.

When compared with the display device in FIG. 6, although a first adhesive layer Paz, a polarizing layer POL, and a support layer BPz of the display device in FIG. 8 are deformed, the remaining components may be substantially the same as those of the display device in FIG. 6. Thus, descriptions of the remaining components will be omitted for convenience of description.

Referring to FIG. 8, the first adhesive layer Paz may not overlap the bending area BA of the display panel DP while overlapping the first non-bending area NBA1 of the display panel DP.

The support layer BPz may overlap each of the first non-bending area NBA1 and the bending area BA. As illustrated in FIG. 9, the support layer BPz includes a first support portion BPza overlapping the first non-bending area NBA1 and a second support portion BPzb overlapping the bending area BA. The first support portion BPza may be disposed on the first adhesive layer PAz overlapping the first flat portion SUB-S1 (refer to FIG. 4A) of the base substrate SUB, and the second support portion BPzb may be disposed on the bending portion SUB-SB of the base substrate SUB.

Also, as illustrated in FIGS. 8 and 9, the second support portion BPzb may be disposed on the bending portion SUB-SB of the base substrate SUB. Also, at least a portion of the second support portion BPzb may be spaced apart from the display panel DP to define an inner space OP.

According to an embodiment of the inventive concept, the first adhesive layer PAz may include a portion disposed between the polarizing layer POL and the display panel DP and a remaining portion disposed between the first support portion BPza and the display panel DP. In an embodiment, the portion of the first adhesive layer PAz may have a planar area greater than that of the remaining portion of the first adhesive layer PAz.

That is, the support layer BPz and the polarizing layer POL in FIG. 8 may also have an integrated shape in which the support layer BPz and the polarizing layer POL contact each other. At least a portion of the support layer BPz, which prevents or substantially prevents the support layer BPz and the polarizing layer POL from being separated from each other, may be adhered to the first adhesive layer PAz.

According to an embodiment of the inventive concept, the support layer and the polarizing layer may be provided as an integrated shape adhered to the adhesive layer. Since the adhesive layer is arranged on the display panel through one process, the support layer and the polarizing layer, which are adhered to the adhesive layer, may also be arranged on the display panel at the same time. As a result, the overall process time of the display device may be reduced.

Although some example embodiments of the present invention have been described, it is to be understood that the present invention should not be limited to these example embodiments, but various changes and modifications may be made by one of ordinary skill in the art within the spirit and scope of the present invention as herein claimed. Hence, the protective scope of the present disclosure shall be determined by the technical scope of the accompanying claims.

What is claimed is:

1. A display device comprising:
a display panel comprising a bending area and a non-bending area adjacent to the bending area;
a polarizing layer on the display panel and overlapping with the non-bending area;
a support layer on the display panel and overlapping with the bending area; and
an adhesive layer comprising a first adhesive portion between the non-bending area of the display panel and the polarizing layer, and a second adhesive portion between the bending area of the display panel and the support layer.

2. The display device of claim 1, wherein the support layer and the polarizing layer are provided as an integrated shape and contacting each other.

3. The display device of claim 1, wherein the second adhesive portion has a curved shape and is arranged over the entire bending area of the display panel, and
the support layer has a curved shape and is arranged over the entire second adhesive portion.

4. The display device of claim 3, wherein each of the support layer and the second adhesive portion does not overlap with the non-bending area.

5. The display device of claim 1, wherein the support layer has a same thickness as the polarizing layer.

6. The display device of claim 1, wherein the display panel comprises:
a base substrate comprising a flat portion corresponding to the non-bending area and a bending portion bent from the flat portion and corresponding to the bending area;
a display element layer on the flat portion; and
an encapsulation layer on the display element layer,
wherein the first adhesive portion is between the encapsulation layer and the polarizing layer.

7. The display device of claim 6, wherein the flat portion comprises a first flat portion and a second flat portion, which are spaced apart from each other in a thickness direction of the base substrate.

8. The display device of claim 7, further comprising a protection layer between the first flat portion and the second flat portion to support the first flat portion.

9. The display device of claim 1, wherein the first adhesive portion and the second adhesive portion are provided as an integrated shape, and
the first adhesive portion and the second adhesive portion have a same thickness as each other.

10. The display device of claim 1, further comprising:
a window comprising a display area and a non-display area adjacent to the display area, and arranged on the polarizing layer; and
a window adhesive layer between the window and the polarizing layer,
wherein the bending area of the display panel entirely overlaps with the non-display area.

11. A display device comprising:
a display panel comprising a bending area and a non-bending area adjacent to the bending area;
a polarizing layer on the display panel and overlapping with the non-bending area;
a support layer comprising a first support portion on the display panel and overlapping with the non-bending area, and a second support portion on the display panel and overlapping with the bending area; and
an adhesive layer comprising a first portion between the display panel and the polarizing layer and overlapping with the non-bending area and a remaining portion between the display panel and the first support portion.

12. The display device of claim 11, wherein the first portion of the adhesive layer has a planar area greater than that of the remaining portion of the adhesive layer.

13. The display device of claim 11, wherein the second support portion has a curved shape and is arranged over the entire bending area of the display panel.

14. The display device of claim 13, wherein the adhesive layer does not overlap with the bending area.

15. The display device of claim 11, wherein the display panel comprises:
a base substrate comprising a flat portion corresponding to the non-bending area and a bending portion bent from the flat portion and corresponding to the bending area;
a display element layer on the flat portion; and
an encapsulation layer on the display element layer and overlapping with the flat portion,
wherein the first support portion is on the adhesive layer overlapping the flat portion, and the second support portion is on the bending portion.

16. The display device of claim 15, wherein at least a portion of the second support portion is spaced apart from the display panel.

17. The display device of claim 11, wherein the adhesive layer has a uniform thickness.

18. The display device of claim 11, wherein the polarizing layer and the support layer are provided as an integrated shape.

19. The display device of claim 11, wherein the support layer has a same thickness as the polarizing layer.

20. The display device of claim 11, wherein the first support portion contacts the polarizing layer.

* * * * *